(12) United States Patent
Wedding et al.

(10) Patent No.: US 11,996,534 B2
(45) Date of Patent: May 28, 2024

(54) ELECTRIC POWER MODULE SYSTEM

(71) Applicant: VOLVO TRUCK CORPORATION, Gothenburg (SE)

(72) Inventors: Christoffer Wedding, Gothenburg (SE); Andreas Stockman, Västra Frölunda (SE); Emil Sjunnesson, Gothenburg (SE)

(73) Assignee: VOLVO TRUCK CORPORATION, Gothenburg (SE)

( * ) Notice: Subject to any disclaimer, the term of this patent is extended or adjusted under 35 U.S.C. 154(b) by 163 days.

(21) Appl. No.: 17/597,202

(22) PCT Filed: Jul. 4, 2019

(86) PCT No.: PCT/EP2019/068034
§ 371 (c)(1),
(2) Date: Dec. 29, 2021

(87) PCT Pub. No.: WO2021/001049
PCT Pub. Date: Jan. 7, 2021

(65) Prior Publication Data
US 2022/0247013 A1 Aug. 4, 2022

(51) Int. Cl.
*H01M 10/6568* (2014.01)
*B60K 1/00* (2006.01)
(Continued)

(52) U.S. Cl.
CPC ......... *H01M 10/6568* (2015.04); *B60L 50/64* (2019.02); *H01M 10/613* (2015.04);
(Continued)

(58) Field of Classification Search
CPC ........... H01M 10/6568; H01M 10/613; H01M 10/625; H01M 10/6556; H01M 2220/20;
(Continued)

(56) References Cited

U.S. PATENT DOCUMENTS

| 8,437,135 B2 * | 5/2013 | Hurmer | B60K 6/22 361/689 |
| 8,691,416 B1 | 4/2014 | Carroll et al. | |

(Continued)

FOREIGN PATENT DOCUMENTS

| CN | 103887576 A | 6/2014 |
| CN | 107054120 A | 8/2017 |
| DE | 102017214487 A1 | 2/2019 |

OTHER PUBLICATIONS

International Search Report and Written Opinion dated Mar. 23, 2020 in corresponding International PCT Application No. PCT/EP2019/068034, 12 pages.

(Continued)

*Primary Examiner* — Hal Kaplan
(74) *Attorney, Agent, or Firm* — Venable LLP; Jeffri A. Kaminski

(57) ABSTRACT

An electric power module system (1) for use in an electrically operated vehicle (21), comprising: —a base module comprising a cooling passage for fluid coolant and coolant connections for supplying fluid coolant to the cooling passage, the base module further comprising at least one external electrical connection for power input to and/or power output from the electric power module system, —an add-on module configured to be mounted to and electrically connected to the base module, so that the add-on module, when mounted, can be cooled and powered via the base module. When the add-on module is mounted, the cooling passage is delimited by at least a first delimiting surface provided on the base module and a second delimiting surface provided on the add-on module, so that fluid coolant supplied via the coolant connections of the base module comes into contact with both of said delimiting surfaces.

6 Claims, 3 Drawing Sheets

(51) Int. Cl.
  *B60K 1/04*      (2019.01)
  *B60L 50/64*     (2019.01)
  *H01M 10/613*    (2014.01)
  *H01M 10/625*    (2014.01)
  *H01M 10/6556*   (2014.01)

(52) U.S. Cl.
  CPC ..... *H01M 10/625* (2015.04); *H01M 10/6556* (2015.04); *B60K 2001/005* (2013.01); *B60K 1/04* (2013.01); *B60K 2001/0438* (2013.01); *B60L 2200/18* (2013.01); *B60L 2200/40* (2013.01); *B60L 2240/525* (2013.01); *B60L 2240/545* (2013.01); *H01M 2220/20* (2013.01)

(58) Field of Classification Search
  CPC .. B60L 50/64; B60L 2200/18; B60L 2200/40; B60L 2240/525; B60L 2240/545; B60L 15/007; B60K 1/04; B60K 2001/005; B60K 2001/0438; H05K 7/20927
  USPC .................................................. 307/9.1, 10.1
  See application file for complete search history.

(56) References Cited

U.S. PATENT DOCUMENTS

| | | | |
|---|---|---|---|
| 9,290,101 B2 * | 3/2016 | Tomokage | B60L 58/20 |
| 9,919,608 B2 * | 3/2018 | Wang | B60L 50/51 |
| 2011/0168476 A1 | 7/2011 | Hurmer | |
| 2013/0241486 A1 | 9/2013 | Tomokage et al. | |
| 2016/0308480 A1 | 10/2016 | Wang et al. | |

OTHER PUBLICATIONS

International Preliminary Report on Patentablility dated Oct. 21, 2021 in corresponding International PCT Application No. PCT/EP2019/068034, 13 pages.

Chinese Office Action dated Apr. 26, 2022 in corresponding Chinese Patent Application No. 201980098039.2, 6 pages.

* cited by examiner

ELECTRIC POWER MODULE SYSTEM

CROSS-REFERENCE TO RELATED APPLICATIONS

This application is a U.S. National Stage application of PCT/EP2019/068034, filed Jul. 4, 2019, and published on Jan. 7, 2021, as WO 2021/001049 A1, all of which is hereby incorporated by reference in its entirety.

TECHNICAL FIELD

The invention relates to an electric power module system for use in an electrically operated vehicle. It further relates to a power system of a vehicle, to an on-board battery charger of a vehicle, and to a vehicle comprising an electric power module system.

The invention can be applied in heavy-duty vehicles, such as trucks, buses and construction equipment. Although the invention will be described with respect to a bus, the invention is not restricted to this particular vehicle, but may also be used in other vehicles such as trucks and passenger cars.

BACKGROUND

There exist various types of electrically operated vehicles. For example, a vehicle can be operated by means of an electric machine solely (all-electric vehicle), or by means of an arrangement comprising both an electric machine and an internal combustion engine. The latter alternative is often referred to as a hybrid vehicle (HEV), and can for example be utilised in a manner in which an internal combustion engine is used for operating the vehicle while driving outside urban areas whereas the electric machine can be used in urban areas or in environments in which there is a need to limit the discharge of harmful pollutants such as carbon monoxide and oxides of nitrogen. Furthermore, a vehicle being operated by means of an internal combustion engine and an electric machine supplied with power from a rechargeable energy storage system is often referred to as a plug-in hybrid electric vehicle (PHEV). A plug-in hybrid electric vehicle uses an energy storage system with rechargeable batteries or another suitable energy source which can be restored into a condition involving a full charge through a connection to an external electric power supply.

In the context of this disclosure, the term "electrically operated vehicles" refers both to pure electric vehicles and to hybrid vehicles.

A powertrain of an electrically operated vehicle comprises on one hand an energy storage system (ESS) including batteries, and on the other hand one or more electric motors for propulsion of the vehicle. Furthermore, the powertrain typically comprises power converter modules for converting direct current (DC) to alternating current (AC), such as inverters, for converting AC to DC, such as rectifiers, and for AC to AC conversion, such as transformers. Examples of such modules used in vehicles are e.g. traction inverters, static converters, auxiliary converters, energy storage converters, generator converters, bidirectional inverters, and static inverters. In order not to overheat the power converter modules, efficient cooling is needed.

Power converters are also used in on-board battery charging of electrically operated vehicles, in which they are used to convert and control AC from an external electric power supply to DC suitable for battery charging. Furthermore, power converters are used to convert power for use in auxiliary systems of the vehicle or in other systems powered via a power system of the vehicle, such as in various systems provided on a trailer of a truck. An example of such a system is a cooling system of a cooling trailer, powered via a power system provided in the truck.

US2011168476 discloses a power module system for a hybrid drive system. The power module system comprises a basic converter module configured to be connected to a first electric machine, and a supplementary converter module configured to be mounted to the basic module and connected to a second electric machine. The basic module further comprises cooling connections for supplying liquid coolant to a cooling channel provided in the basic module. When mounted to the basic module, the supplementary module may be cooled via the basic module.

SUMMARY

An object of the invention is to provide an electric power module system for an electrically operated vehicle, which is in at least some aspect improved in comparison with prior art systems and which is suitable both for use in on-board chargers and in a powertrain of the vehicle. In particular, it is an object to provide an electric power module system having improved cooling capabilities. Another object is to provide an in at least some aspect improved powertrain of an electrically operated vehicle.

According to a first aspect of the invention, at least one of the objects is achieved by an electric power module system for use in an electrically operated vehicle according to claim 1. The electric power module system comprises:
- a base module comprising a cooling passage for fluid coolant and coolant connections for supplying fluid coolant to the cooling passage, the base module further comprising at least one external electrical connection for power input to and/or power output from the electric power module system,
- an add-on module configured to be mounted to and electrically connected to the base module, so that the add-on module, when mounted, can be cooled and powered via the base module, wherein, when the add-on module is mounted to the base module, the cooling passage is delimited by at least a first delimiting surface provided on the base module and a second delimiting surface provided on the add-on module, so that fluid coolant supplied via the coolant connections of the base module comes into contact with both of said delimiting surfaces.

By the provision of an electric power module system in which the cooling passage is delimited by on one hand a surface on the base module and on the other hand a surface of the add-on module, fluid coolant, e.g. liquid coolant, comes into contact with both the base module and the add-on module, and a more efficient cooling of the add-on module may thereby be achieved in contrast to systems in which the cooling passage is only delimited by surfaces provided on the base module. Moreover, a more compact and space efficient design can be achieved.

The electric power module system may be used in a power system of an electrically operated vehicle, such as in a powertrain of such a vehicle, or in connection with e.g. an on-board battery charger of such a vehicle.

The base module and the add-on modules are electric power modules, such as power conversion modules or battery modules.

According to one embodiment, the electric power module system further comprises power connection means for electrically connecting the modules to each other via mutually facing and connected sides of the modules. The connection between the modules may thereby be hidden when the modules are mounted together, so that the electric power module system becomes more easy to handle and so that the connection is better protected when in use. A sealing member may preferably be provided to separate the connection from the cooling passage, such as a sealing member extending around and outlining the cooling passage.

According to one embodiment, the electric power module system further comprises signal connection means for communicating signals between the modules via mutually facing and connected sides of the modules, wherein the base module comprises at least one external signal connection. Thereby, it is not necessary to provide any external connections on the add-on module, but instead the add-on module may be powered and controlled via the base module. The number of external connections and wiring may thus be minimized.

According to one embodiment, the add-on module may thus comprise electrical and signal connections only on its side configured to face the base module.

According to one embodiment, the base module further comprises a removable first lid configured to be mounted to the base module instead of the add-on module so that, when the removable first lid is mounted, the cooling passage is delimited by at least the first delimiting surface provided on the base module and a third delimiting surface provided on the removable first lid. This makes it possible to use the base module independently of the add-on module, with the first lid mounted.

According to one embodiment, when the removable first lid is mounted to the base module, a first connection interface for electrically and/or communicatively connecting the base module to the add-on module is covered by the removable first lid. The lid protects the connections when the add-on module is not mounted.

According to one embodiment, the add-on module further comprises a removable second lid configured to be mounted to the add-on module instead of the base module, said second delimiting surface being covered by the removable second lid. This makes the add-on module easier to handle when not mounted.

According to one embodiment, when the removable second lid is mounted to the add-on module, a second connection interface for electrically and/or communicatively connecting the add-on module to the base module is covered by the removable second lid. The connections are thereby efficiently protected by the lid.

According to one embodiment, at least one of the base module and the add-on module is a power conversion module. Both modules may be power conversion modules. Preferably, both modules may be power conversion modules of the same type. The power conversion module may be configured for DC to DC power conversion, for AC to AC power conversion, for AC to DC power conversion, or for DC to AC power conversion. The power conversion module may e.g. be a traction inverter, a static converter, an auxiliary converter, an energy storage converter, a generator converter, a bidirectional inverter, or a static inverter.

According to one embodiment, the base module and the add-on module are power conversion modules, and the add-on module is configured to, when mounted to the base module, increase a power conversion capacity of the electric power module system, so that a maximum amount of converted power available via the at least one external electrical connection of the base module is increased. This is useful e.g. when additional power conversion capacity is needed for driving an electric machine connected to the base module, or in on-board chargers where compact arrangements for high capacity power conversion are desirable. By providing external connections only on the base module and no external connections on the add-on module, the add-on module may purely be added for increasing a power conversion capacity of the system. The base module and the add-on module are thus not used in the powering of separate machines, but in the powering of the same machine.

According to one embodiment, the electric power module system further comprises at least one sealing member for sealing the cooling passage. The sealing member may e.g. be a rubber sealing or a gasket configured to seal off the cooling passage when either the add-on module or the first removable lid is mounted on the base module, thereby preventing leakage of fluid coolant from the cooling passage.

According to a second aspect of the invention, a power system of a vehicle is provided, comprising:
  an energy storage system,
  at least one electric machine,
  an electric power module system according to the first aspect of the invention, wherein the base module is electrically connected to the energy storage system and to the at least one electric machine, and wherein the add-on module is mounted to and electrically connected to the base module, the cooling passage being delimited by the first delimiting surface provided on the base module and the second delimiting surface provided on the add-on module, so that fluid coolant supplied via the coolant connections of the base module comes into contact with both of said delimiting surfaces.

The power system may e.g. be a powertrain of the vehicle, or a power system for powering auxiliary systems or devices. Advantages and advantageous embodiments of such a power system appear from the above description of the electric power module system.

According to a third aspect of the invention, an on-board battery charger of an electrically operated vehicle comprising the proposed electric power module system is provided, wherein the base module is configured to be electrically connected to an energy storage system and to an external alternating current power supply, and wherein the add-on module is mounted to and electrically connected to the base module, the cooling passage being delimited by the first delimiting surface provided on the base module and the second delimiting surface provided on the add-on module, so that fluid coolant supplied via the coolant connections of the base module comes into contact with both of said delimiting surfaces.

The invention also relates to a vehicle comprising an electric power module system according to the first aspect of the invention. The vehicle may preferably be a heavy-duty vehicle, such as a truck or a bus. The vehicle may preferably be an electrically operated heavy-duty vehicle. The vehicle may comprise the proposed power system and/or the proposed on-board battery charger.

Further advantages and advantageous features of the invention are disclosed in the following description and in the dependent claims.

BRIEF DESCRIPTION OF THE DRAWINGS

With reference to the appended drawings, below follows a more detailed description of embodiments of the invention cited as examples.

In the drawings.

It is to be noted that all drawings are schematic. Details may thus be omitted and the various features may not be drawn to scale.

DETAILED DESCRIPTION OF EXAMPLE EMBODIMENTS OF THE INVENTION

Figure 1:
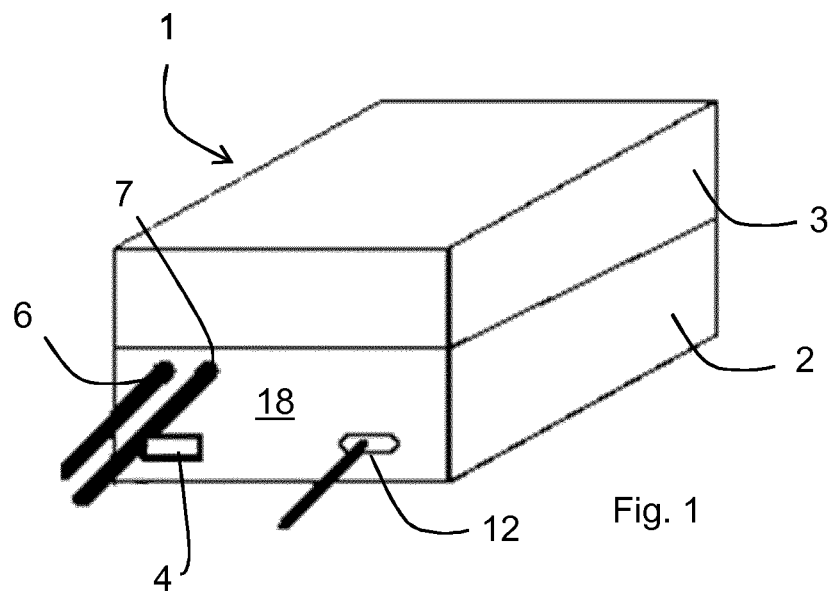
FIG. 1 is a perspective view of an electric power module system according to an embodiment of the invention.
Figure 5:
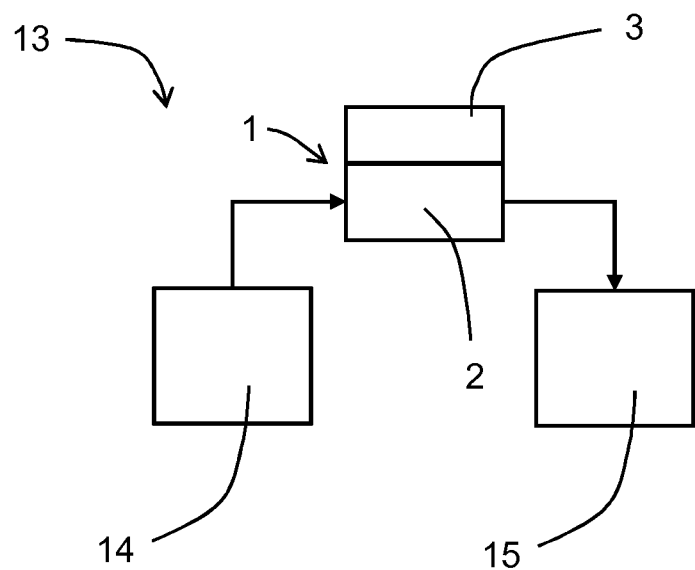
FIG. 5 is a schematic view of a power system comprising the electric power module system according to an embodiment of the invention, FIG. 6 schematically shows a vehicle comprising the electric power module system according to an embodiment of the invention.

An electric power module system 1 according to an embodiment of the invention is schematically shown in FIG. 1. The electric power module system 1 comprises a base module 2 in the form of a power converter and an add-on module 3, also in the form of a power converter. As schematically illustrated in FIG. 5, the electric power module system 1 is intended to be mounted in a power system 13 of an electrically operated vehicle and connected to on one hand an energy storage system (ESS) 14, comprising one or more battery packs providing input power to the base module 2, and on the other hand an electric machine 15 powered by the ESS 14 via the base module 2. The electric power module system 1 may alternatively be configured for use in connection with an on-board charger, in which case it is configured to be connected to an external AC power supply and to an energy storage system, e.g. a battery pack, and for AC-DC power conversion.

Figure 2:
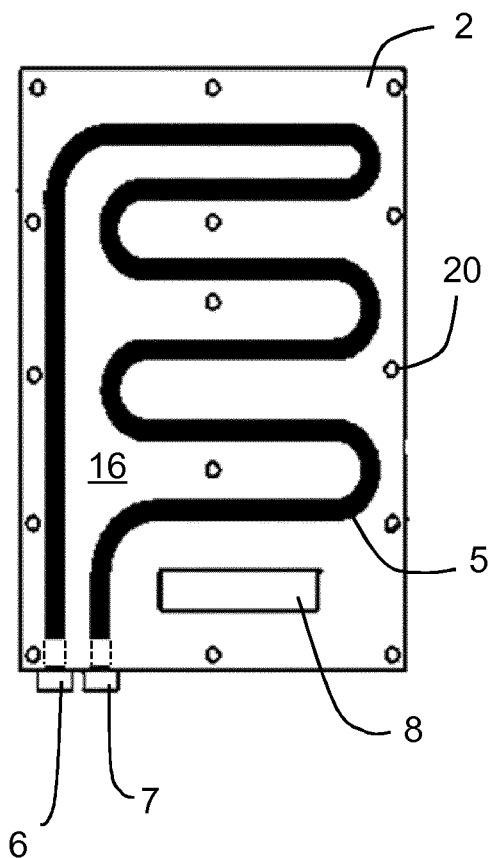
FIG. 2 is a top view of a base module of the electric power module system in FIG. 1.

As shown in FIG. 2, a cooling passage 5 for fluid coolant, a coolant input connection 6 and a coolant output connection 7 for connection to a fluid coolant supply system (not shown) are provided on the base module 2. The base module 2 further comprises an external electrical connection 4 (see FIG. 1) for power input to and power output from the electric power module system 1. The external connection 4 may be configured e.g. for AC input and output, and for DC input and output, i.e. for independently connecting to different power sources and power consumers.

Figure 3:
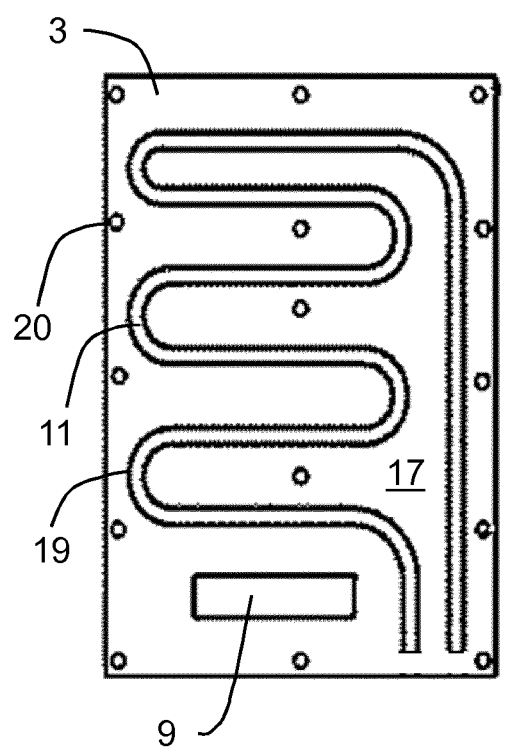
FIG. 3 is a bottom view of an add-on module of the electric power module system in FIG. 1.

Both modules 2,3, have basic shapes of rectangular cuboids. The cooling passage 5 is herein provided on an upper side 16 of the base module configured to face a lower side 17 of the add-on module 3, shown in FIG. 3, while the electrical connection 4 and the coolant connections 6, 7 are provided on a side face 18 of the base module 2. An external signal connection 12 for communicating signals to the electric power module system 1 is further provided on the side face 18 of the base module 2. A first connection interface 8 is provided on the base module 2, and a second connection interface 9 is provided on the add-on module 3, for signal communication between and for electrical connection of the modules 2, 3. Of course, more than one external electrical connection may be provided on the base module depending on the intended use of the electric power module system.

The add-on module 3 is in FIG. 1 mounted to and electrically connected to the base module 2 via the connection interfaces 8, 9. The add-on module 3, when mounted, can thereby be cooled and powered via the base module 2.

Figure 4:
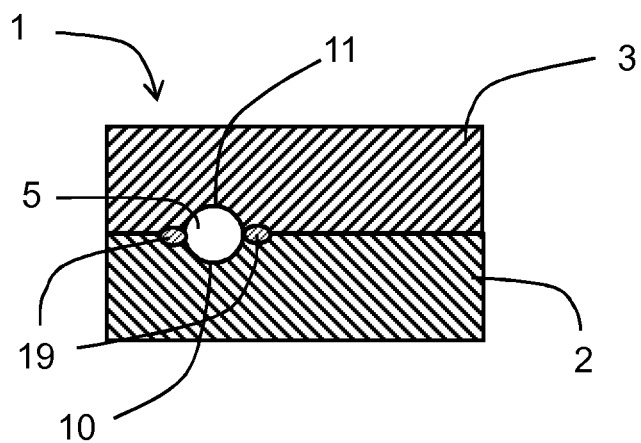
FIG. 4 is a sectional view of a part of the electric power module system in FIG. 1.

As shown in FIG. 4, schematically showing a section of a part of the electric power module system 1, when the add-on module 3 is mounted to the base module 2, the cooling passage 5 is delimited by a first delimiting surface 10 provided on the upper side 16 of the base module 2 and a second delimiting surface 11 provided on the lower side 17 of the add-on module 3. The delimiting surfaces 10, 11 are formed as channels in the respective upper side 16 and lower side 17. Fluid coolant circulated via the coolant connections 6, 7 of the base module 2 thereby comes into contact with both of said delimiting surfaces 10, 11. A sealing member 19, e.g. a rubber sealing member, is provided for sealing the cooling passage 5. In the shown embodiment, the sealing member 19 is shown as being provided on the add-on module 3, but it may also be mounted on the base module, or on each of the base module and the add-on module.

The base module 2 further comprises a removable first lid (not shown) configured to be mounted to the base module 2 instead of the add-on module 3 so that, when the removable first lid is mounted, the cooling passage 5 is delimited by the first delimiting surface 10 provided on the base module 2 and a third delimiting surface (not shown) provided on the removable first lid. The removable first lid may be configured so that the cooling passage 5 has the same configuration regardless of whether the first lid or the add-on module 3 is mounted to the base module 2. The removable first lid may also be configured to, when mounted, cover and hide the first connection interface 8.

The add-on module 3 may also comprise a removable second lid (not shown) configured to be mounted to the add-on module 3 instead of the base module 2. When mounted, the second lid covers the second delimiting surface 11 of the add-on module 3, and also the second connection interface 9 for electrically and communicatively connecting the add-on module 3 to the base module 2.

Means for mechanically connecting the add-on module to the base module may be provided, e.g. female and male fastening members. In the shown embodiment, purely by way of example, this is illustrated by a plurality of holes 20 provided on the base module 2 on the add-on module 3, configured to receive plugs, screws, pins or similar to connect the modules.

Figure 6:
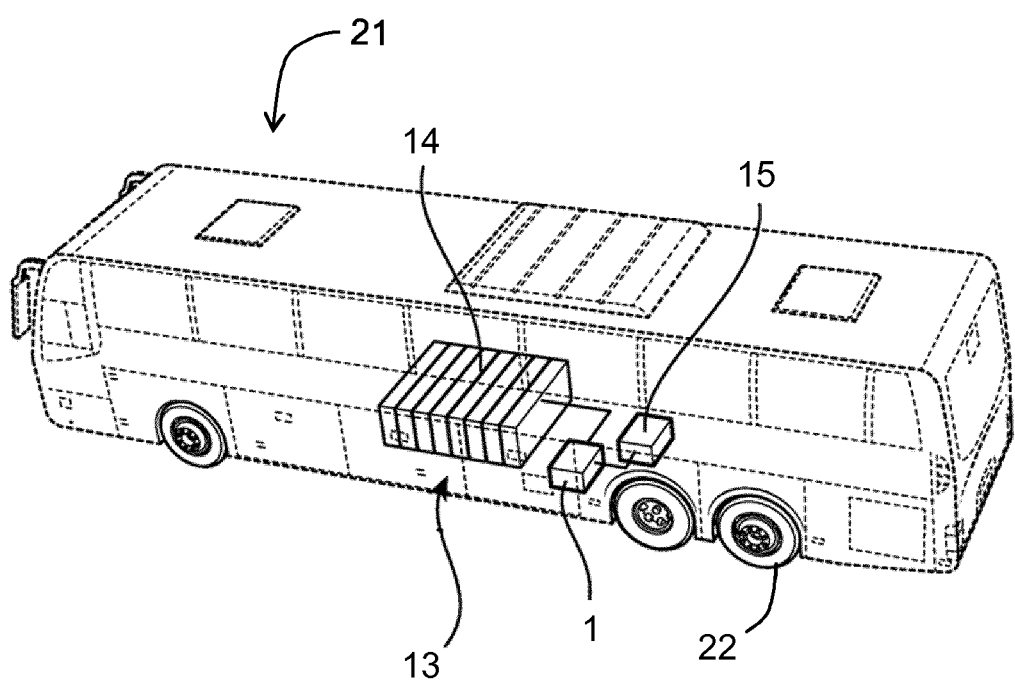

FIG. 6 schematically shows an electrically operated vehicle 21 in which the electric power module system 1 may be used. The vehicle 21 is propelled by a schematically illustrated powertrain 13 comprising an energy storage system 14 with a plurality of battery units, an electric power module system 1, and an electric machine 15 for propelling drive wheels 22 of the vehicle 21. It is to be understood that this is merely an example serving to illustrate how the electric power module system 1 may be used in a vehicle. It may also be used in connection with e.g. on-board charging of an energy storage system of the vehicle, or in the conversion of power used by other systems or devices on the vehicle or on e.g. trailers connected to the vehicle, such as various auxiliary systems and devices.

It is to be understood that the present invention is not limited to the embodiments described above and illustrated in the drawings; rather, the skilled person will recognize that many changes and modifications may be made within the scope of the appended claims.

The invention claimed is:

1. An electric power module system for use in an electrically operated vehicle, comprising:
   a base module comprising a cooling passage for fluid coolant and coolant connections for supplying fluid coolant to the cooling passage, the base module further comprising at least one external electrical connection for power input to and/or power output from the electric power module system,
   an add-on module configured to be mounted to and electrically connected to the base module, so that the add-on module, when mounted and electrically connected to the base module, can be cooled and powered via the base module,
   wherein the base module and the add-on module are power conversion modules of the same type, and wherein the add-on module is configured to, when mounted to and electrically connected to the base module, increase a power conversion capacity of the electric power module system, so that a maximum amount of converted power available via the at least one external electrical connection of the base module is increased,
   wherein, when the add-on module is mounted to the base module, the cooling passage is delimited by at least a first delimiting surface provided on the base module and a second delimiting surface provided on the add-on module, so that fluid coolant supplied via the coolant connections of the base module comes into contact with both of said delimiting surfaces the electric power module system further comprises
   power connection means for electrically connecting the modules to each other via mutually facing and connected sides of the modules, and
   signal connection means for communicating signals between the modules via mutually facing and connected sides of the modules, wherein the base module comprises at least one external signal connection.

2. The electric power module system according to claim 1, further comprising at least one sealing member for sealing the cooling passage.

3. A power system of an electrically operated vehicle, comprising:
   an energy storage system,
   at least one electric machine,
   an electric power module system according to claim 1, wherein the base module is electrically connected to the energy storage system and to the at least one electric machine, and wherein the add-on module is mounted to and electrically connected to the base module, the cooling passage being delimited by the first delimiting surface provided on the base module and the second delimiting surface provided on the add on module, so that fluid coolant supplied via the coolant connections of the base module comes into contact with both of said delimiting surfaces.

4. An on-board battery charger of an electrically operated vehicle, comprising the electric power module system according to claim 1, wherein the base module is configured to be electrically connected to an energy storage system, and wherein the add-on module is mounted to and electrically connected to the base module, the cooling passage being delimited by the first delimiting surface provided on the base module and the second delimiting surface provided on the add-on module, so that fluid coolant supplied via the coolant connections of the base module comes into contact with both of said delimiting surfaces.

5. A vehicle comprising an electric power module system according to claim 1.

6. A vehicle according to claim 5, wherein the vehicle is a heavy-duty vehicle.

* * * * *